(12) United States Patent
Toyama

(10) Patent No.: US 7,262,446 B2
(45) Date of Patent: Aug. 28, 2007

(54) SEMICONDUCTOR DEVICE AND PROCESS FOR PRODUCTION THEREOF

(75) Inventor: Takayuki Toyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/103,121

(22) Filed: Apr. 11, 2005

(65) Prior Publication Data

US 2005/0179054 A1 Aug. 18, 2005

Related U.S. Application Data

(63) Continuation of application No. 10/983,784, filed on Nov. 8, 2004, now Pat. No. 7,141,465.

(51) Int. Cl.
*H01L 31/0328* (2006.01)
*H01L 21/336* (2006.01)

(52) U.S. Cl. ............ 257/192; 257/194; 257/195; 257/197; 257/14; 257/20; 257/23; 257/E21.407

(58) Field of Classification Search .............. None
See application file for complete search history.

(56) References Cited

U.S. PATENT DOCUMENTS 5,161,235 A * 11/1992 Shur et al. .............. 257/24
6,281,528 B1 * 8/2001 Wada ...................... 257/200
6,410,947 B1 * 6/2002 Wada ...................... 257/194
6,534,790 B2 3/2003 Kato et al.

* cited by examiner

*Primary Examiner*—Sue A. Purvis
*Assistant Examiner*—Fazli Erdem
(74) *Attorney, Agent, or Firm*—Robert J. Depke; Rockey, Depke & Lyons, LLC.

(57) ABSTRACT

A semiconductor device which is capable of operating with a single positive power supply and has a low gate resistance, and a process for production thereof.

The semiconductor device includes a channel layer (which constitutes a current channel), a first semiconductor layer formed on said channel layer, a second semiconductor layer in an island-like shape doped with a conductive impurity and formed on said first semiconductor layer, and a gate electrode formed on said second semiconductor layer, wherein said first and second semiconductor layers under said gate electrode have a conductive impurity region formed therein to control the threshold value of current flowing through said channel layer, and the conductive impurity region formed in second semiconductor layer is doped with a conductive impurity more heavily than in the conductive impurity region formed in said first semiconductor layer.

7 Claims, 11 Drawing Sheets

F I G. 2 I
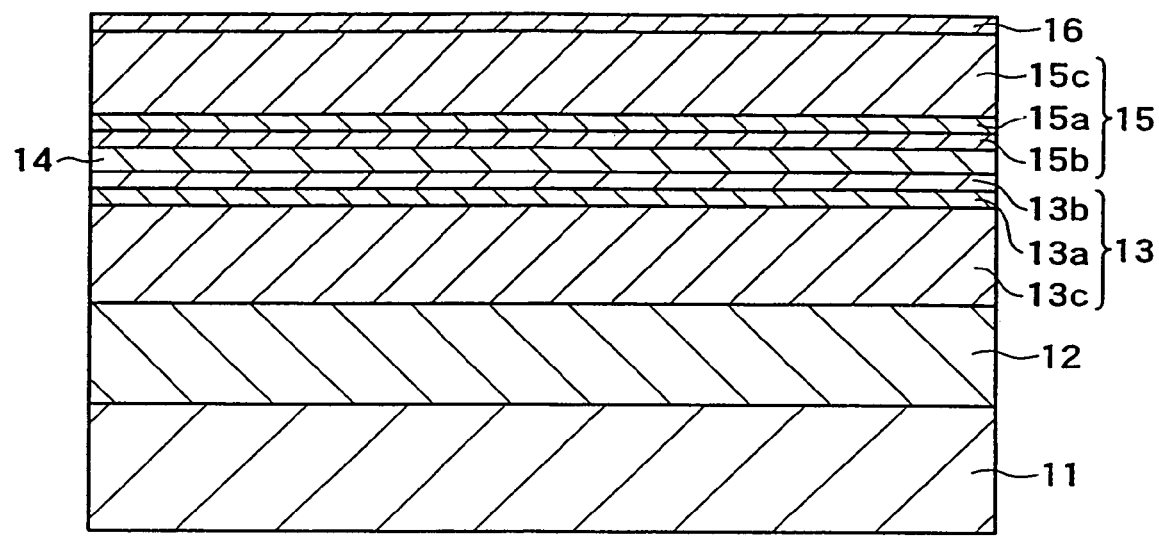
F I G. 2 J
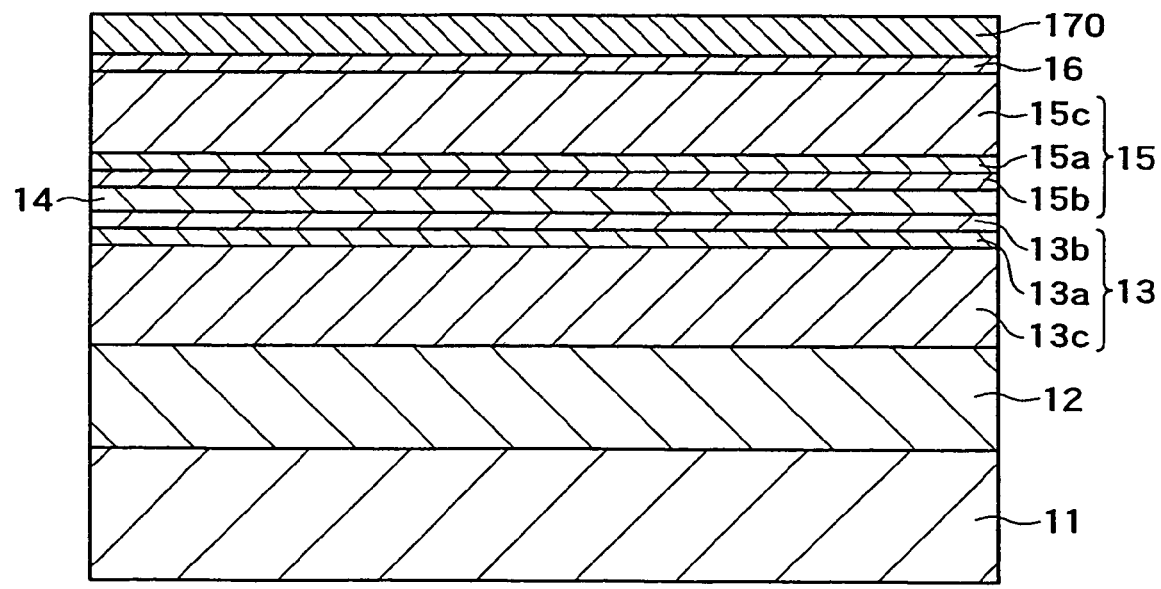

F I G. 5
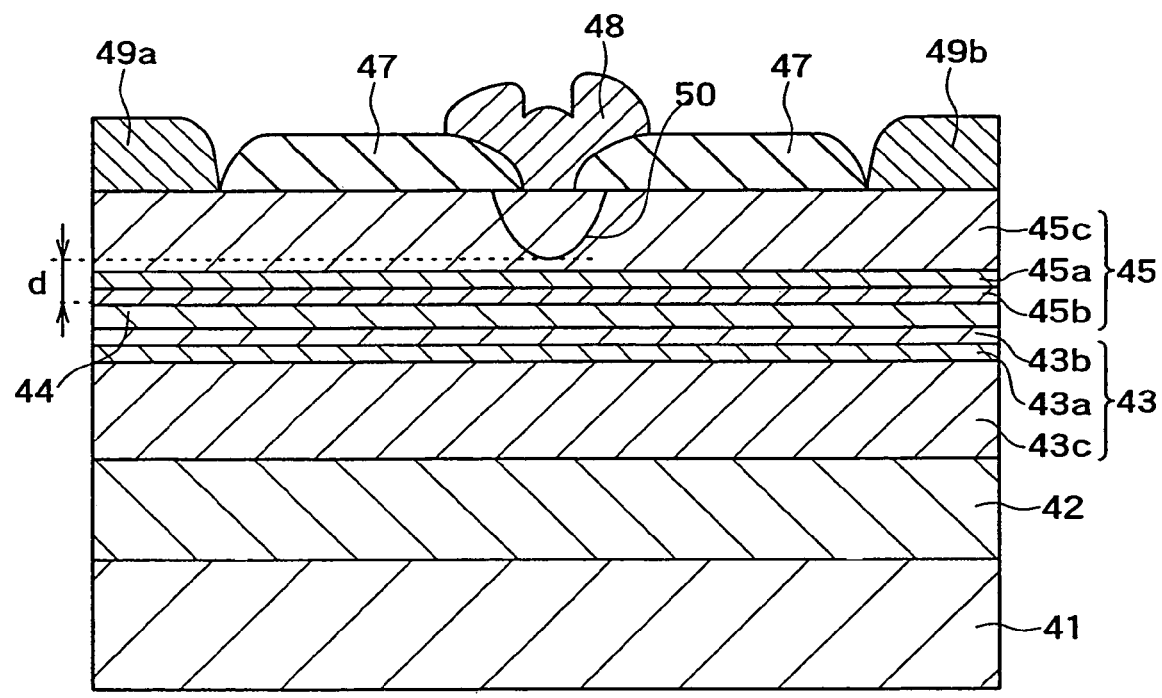

SEMICONDUCTOR DEVICE AND PROCESS FOR PRODUCTION THEREOF

The subject matter of application Ser. No. 10/983,784 is incorporated herein by reference. The present application is a continuation of U.S. application Ser. No. 10/983,784, filed Nov. 8, 2004, now U.S. Pat. No. 7,141,465 which claims priority to U.S. patent application No. 10/194,554, filed Jul. 12, 2002, and Japanese Patent Application No. JP2001-220532, filed Jul. 19, 2001. The present application claims priority to these previously filed application.

BACKGROUND OF THE INVENTION

The present invention relates to a semiconductor device such as high electron mobility transistor and a process for production thereof. This semiconductor device has more than one semiconductor layer of laminate structure therein that permit high speed charge transit.

The recent mobile communication system requires its terminals, such as portable telephones, to have smaller size and less power consumption than before. The same requirement as above is imposed also on devices (such as transistors) constituting each terminal. For example, the power amplifier for digital cellular phones supporting the present-day mobile communication is required to operate efficiently at a low voltage with a single positive power supply.

Among devices in practical use as a power amplifier are the high electron mobility transistor (HEMT) and the pseudomorphic HEMT (PHEMT). The latter is characterized by its epitaxial structure with some intentional lattice mismatches for much higher electron mobility. They are designed to perform current modulation by using the heterojunction structure.

The above-mentioned PHEMT has a structure as shown in section in FIG. 4. It is composed of a semi-insulating substrate 31 of single crystal GaAs, a buffer layer 32 of GaAs not doped with impurity, a first barrier layer 33 of AlGaAs, a channel layer 34 of InGaAs, and a second barrier layer 35 of AlGaAs, which are formed on top of the other. The barrier layer 33 is composed of a carrier supply layer 33a containing an impurity of a first conduction type (e.g., n-type) and high-resistance layers 33b and 33c. Similarly, the barrier layer 35 is composed of a carrier supply layer 35a and high-resistance layers 35b and 35c.

On the second barrier layer 35 are arranged an n-type GaAs layer 36 containing an n-type impurity and an insulting layer 37.

Openings forms in the insulating film 37. A source electrode 39a and a drain electrode 39b form in each of the openings, with an n-type GaAs layer 36 placed thereunder. A gate electrode 38 forms in another opening in the insulating film 37. This structure permits the current flowing from the source electrode 39a to the drain electrode 39b to change in response to the voltage applied to the gate electrode 38.

The above-mentioned PHEMT usually has the recessed structure in which the second barrier layer 35 is made thin under the gate electrode. In this case, the channel layer just below it has a region in which carriers are depleted or there are less carriers than in the channel layer of other structure.

The thus structured PHEMT is characterized by its ability to accumulate carriers in the channel layer 34 upon application of positive voltage to the gate electrode 38. In principle, it is superior to MES-FET (Metal Semiconductor FET) in linearity of mutual conductance (Gm) versus gate voltage (Vg). This feature is greatly advantageous to improvement in efficiency of power amplifiers.

One of the transistors capable of operating with a single positive power supply is the junction field effect transistor (JFET) in which the semiconductor just below the gate electrode is doped with an impurity of a second conduction type (say, p-type) such that the built-in potential ($\phi$bi) increases between the semiconductor of a first conduction type forming the channel layer and the semiconductor of a second conduction type just below the gate electrode.

Doping with an impurity of a second conduction,type is not an only way of increasing the built-in potential. The same object is achieved by forming the layer just below the gate electrode from a semiconductor having a larger bandgap than that used for the channel layer. The PHEMT shown in FIG. 4 is based on this technology.

The combination of the advantages of JFET and PHEMT gives a junction PHEMT (JPHEMT), whose structure is shown in FIG. 5.

The JPHEMT shown in FIG. 5 includes a substrate 41 of semi-insulating single-crystal GaAs, a buffer layer 42 of undoped GaAs, a first barrier layer 43 of AlGaAs, a channel layer 44 of InGaAs, and a second barrier layer 45 of AlGaAs, which are sequentially arranged on top of the other.

The barrier layer 43 includes a carrier supply layer 43a containing an impurity of a first conduction type (n-type) and high-resistance layers 43b and 43c. Similarly, the barrier layer 45 includes a carrier supply layer 45a and high-resistance layers 45b and 45c.

On the second barrier layer 45 is arranged an insulating film 47 having openings. Two of these openings form a source electrode 49a and a drain electrode 49b. Another opening in the insulating film 47 forms a gate electrode 48. A gate impurity region 50 forms in the second barrier layer 45 just below the gate electrode 48. The gate impurity region 50 is an impurity (Zn) of a second conduction type (p-type). The above mentioned JPHEMT also has a structure that permits the current flowing from the source electrode 49a to the drain electrode 49b to change in response to the voltage applied to the gate electrode 48.

The JPHEMT constructed as mentioned above is characterized in that the smaller is the distance (d) between the gate impurity region 50 and the channel layer 44, the greater is the built-in potential ($\phi$bi) between the semiconductor constituting the channel layer 44 and the gate impurity region 50 just below the gate electrode. This allows the JPHEMT to operate only with a single positive power supply.

Unfortunately, the JPHEMT shown in FIG. 5 has a drawback as follows. In the case where the second barrier layer 45 is formed from AlGaAs and the region just below the gate electrode is doped with an impurity (Zn) of a second conduction type (p-type) by vapor phase diffusion, Zn diffuses rapidly in the AlGaAs layer on account of its large diffusion coefficient. Therefore, even though the amount of Zn is small, diffusion takes place such that the bottom of the Zn diffusion region extends to the depth, witch is a distance (d), away from the channel layer 44. The result is that the impurity (Zn) of a second conduction type in the uppermost layer of the second barrier layer 45 forms from AlGaAs has a concentration which is about one half that in the case where the second barrier layer 45 is formed from GaAs. This low concentration leads to a poor ohmic contact, which in turn results in a high gate resistance unfavorable to the gain of power amplifiers.

As mentioned above, for the JPHEMT to have a large value of $\phi$bi and to operate with a single positive power supply, it is necessary to form the second barrier layer 45 from a semiconductor (such as AlGaAs) having a large bandgap. In addition, for the gate electrode to have a good ohmic contact, it is necessary to increase the concentration of the impurity of a second conduction type in the outermost surface of the second barrier layer 45.

SUMMARY OF THE INVENTION

It is an object of the present invention to provide a semiconductor device which is capable of operating with a single positive power supply and has a low gate resistance. It is another object of the present invention to provide a process for producing the semiconductor device.

According to an aspect of the present invention, a semiconductor device includes a channel layer, a first semiconductor layer formed on the channel layer, a second semiconductor layer in an island-like shape doped with a conductive impurity and formed on the first semiconductor layer, and a gate electrode formed on the second semiconductor layer. The first and second semiconductor layers under the gate electrode have a conductive impurity region formed therein to control the threshold value of current flowing through the channel layer, and the conductive impurity region formed in second semiconductor layer is doped with a conductive impurity more heavily than in the conductive impurity region formed in the first semiconductor layer.

The semiconductor device defined above may include the first semiconductor layer which is formed from a semiconductor material having a larger bandgap than that from which the channel layer is formed.

The semiconductor device defined above may include that the first semiconductor layer has a carrier supply layer which contains an impurity of a first conduction type and supplies charges to the channel layer, and the conductive impurity region of a second conduction type is formed in the first and second semiconductor layers between the carrier supply layer and the gate electrode.

The semiconductor device defined above may include that the channel layer that is formed from InGaAs and the first semiconductor layer that is formed from AlGaAs.

Preferably, the semiconductor device defined above further has a source electrode and a drain electrode which are formed on the first semiconductor layer and are separated from each other with the gate electrode in between.

The semiconductor device defined above may further have a third semiconductor layer which is formed under the channel layer and is formed from a semiconductor material having a larger bandgap than that from which the channel layer.

In this semiconductor device, the third semiconductor layer may have a carrier supply layer which contains an impurity of a first conduction type and supplies charges to the channel layer.

The above-mentioned semiconductor device according to an aspect of the present invention produces the following effects.

(i) Since the first and second semiconductor layers under the gate electrode have the conductive impurity region to control the threshold value of current flowing through the channel layer, the threshold value of current flowing through the channel layer varies depending on the distance between the conductive impurity region and the channel layer.

(ii) Since the conductive impurity region formed in the second semiconductor layer is doped with a conductive impurity more heavily than the conductive impurity region formed in the first semiconductor layer, the contact resistance of the gate electrode is effectively reduced.

According to an aspect the present invention, a process for producing a semiconductor device includes a step of forming a channel layer, a step of forming a first semiconductor layer on the channel layer, a step of forming a second semiconductor layer containing an impurity of a first conduction type on the first semiconductor layer, a step of forming a masking layer having an opening which causes the second semiconductor layer to be partly exposed, a step of introducing an impurity of a second conduction type into the second and first semiconductor layers by using the masking layer as the mask, and a step of forming a gate electrode on at least that part of the second semiconductor layer which is exposed in the opening.

Preferably, the process defined above further includes the step of forming the second semiconductor layer that is accomplished by epitaxial growth which introduces the first conductive impurity.

Preferably, the process defined above further includes the step of introducing an impurity of a second conduction type into the second and first semiconductor layers, which step is accomplished by vapor phase diffusion or ion implantation.

Preferably, the process defined above further includes the impurity of a first conduction type and the impurity of a second conduction type are of the same kind.

The process defined above further includes both the impurity of a first conduction type and the impurity of a second conduction type containing Zn.

Preferably, the process defined above further includes a step of forming a stopper layer which differs in etching selective ratio from the second semiconductor layer, the step being carried out after the step of forming the first semiconductor layer and before the step of forming the second semiconductor layer, and the second semiconductor layer being formed on the stopper layer in the step of forming the second semiconductor layer.

Preferably, the process defined above further includes the step of forming the gate electrode, which is followed by a step of performing etching, by using the gate electrode as the mask, on the masking layer and the second semiconductor layer to such an extent that the stopper layer is exposed, while leaving unetched that part of the masking layer and the semiconductor layer which is under the gate electrode.

Preferably, the process defined above further includes the step of removing the masking layer and the second semiconductor layer by etching, which step is followed by a step of forming a source electrode and a drain electrode which are separated from each other on the stopper layer with the gate electrode in between.

Preferably, the process defined above further includes the channel layer that is formed from InGaAs and the first semiconductor layer that is formed from AlGaAs.

According to an aspect of the present invention, the process for producing a semiconductor device includes to form a first semiconductor layer on a channel layer, a second semiconductor layer containing an impurity of a first conduction type on the first semiconductor layer, a masking layer having an opening which causes part of the second semiconductor layer to be exposed, introducing an impurity of a second conduction type into the second and first semiconductor layers by using the masking layer as the mask, and a gate electrode on at least that part of the second semiconductor layer which is exposed in the opening.

Moreover, according to an aspect of the above-mentioned process, the second semiconductor layer is formed by epitaxial growth with an impurity of a first conduction type. In this way it is possible to introduce into the second semiconductor layer an impurity of a first conduction type in a concentration sufficient to reduce the contact resistance of the gate electrode.

Subsequently, an impurity of a second conduction type is introduced into the second and first semiconductor layers by vapor phase diffusion or ion implantation. In this way it is possible to introduce an impurity of a second conduction type into a desired depth and regulating this depth permits the threshold value of current flowing through the channel layer to be controlled.

BRIEF DESCRIPTION OF THE DRAWINGS

These and other objects of the invention will be seen by reference to the description, taken in connection with the accompanying drawing, in which;

FIGS. 2I and 2J are sectional views showing the step of forming a layer for high-concentration gate impurity, subsequent to the step of shown in FIGS. 2G and 2H, of producing a semiconductor device;

FIG. 5 is a sectional view showing the structure of a conventional JPHEMT.

DETAILED DESCRIPTION OF THE PREFERRED EMBODIMENTS

Figure 1:
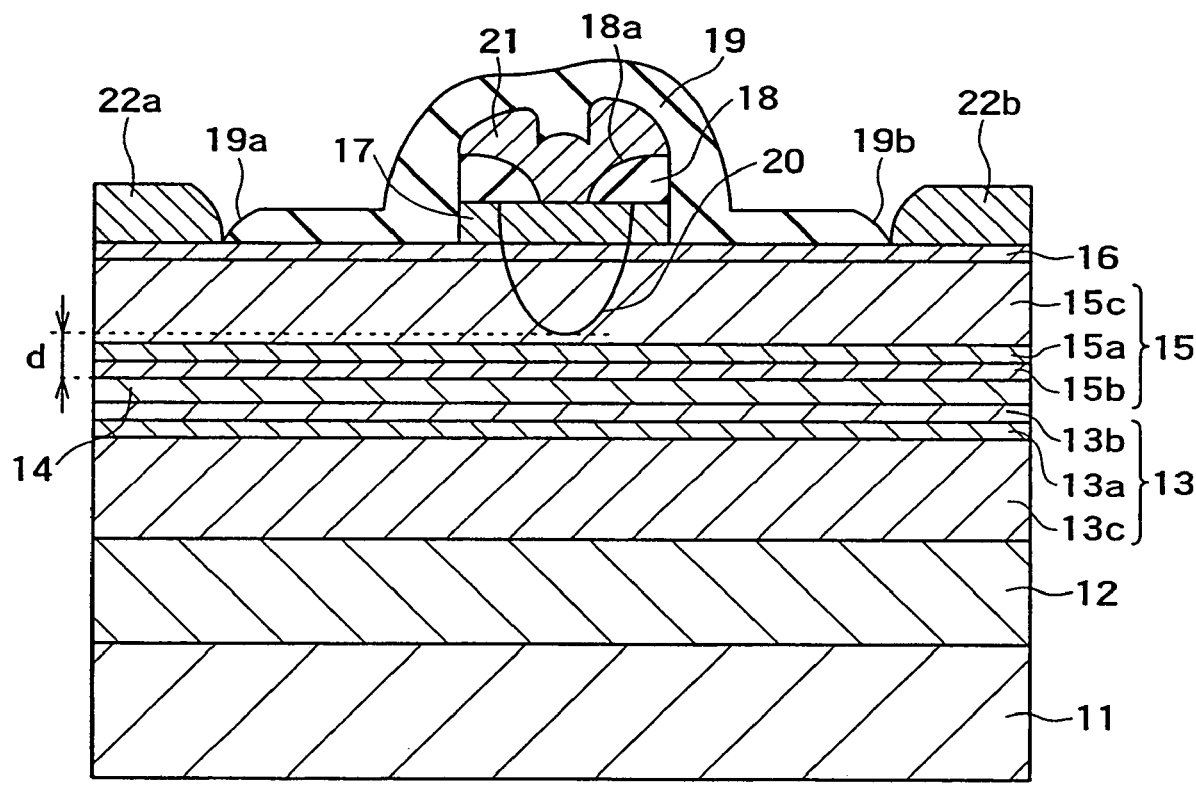
FIG. 1 is a sectional view showing the structure of a semiconductor device pertaining to one embodiment of the present invention.

FIG. 1 is a sectional view showing the structure of the semiconductor device pertaining to one embodiment of the present invention.

The semiconductor device shown in FIG. 1 includes a substrate 11 of half-insulating single-crystal GaAs, a buffer layer 12 of undoped GaAs, a first barrier layer 13 of III-V compound semiconductor, a channel layer 14, and a second barrier layer 15, which are sequentially arranged on top of the other.

The second barrier layer 15 has an etching stopper layer 16 (mentioned later) formed thereon by deposition to a desired thickness (say, about 5 nm). A high-concentration gate impurity layer 17 forms on part of the stopper layer 16 by deposition in an island-like shape.

An insulation film 18 forms on the high-concentration gate impurity layer 17 by deposition to a desired thickness, say about 300 nm. The insulating film 18 has an opening 18a. A gate electrode 21 forms on the insulating film 18 through the opening 18a.

The stopper layer 16 and the gate electrode 21 are covered with an insulating film 19 by deposition to a desired thickness, say about 300 nm. The insulating film 19 (on the stopper layer 16) has two openings 19a and 19b a certain distance apart. In these openings 19a and 19b are formed a source electrode 22a and a drain electrode 22b, respectively.

A gate impurity region 20 (doped with an impurity of a second conduction type) is so formed as to penetrate the high-concentration impurity layer 17 (under the gate electrode 21), the stopper layer 16, and the second barrier layer 15. The gate impurity region 20 is doped with a p-type impurity (Zn) by gas phase diffusion.

More detailed mention is made below of individual layers.

The barrier layers 13 and 15 are formed from a semiconductor having a broader bandgap than the semiconductor forming the channel layer 14. Such a semiconductor should preferably be $Al_xGa_{1-x}As$ (mixed crystal), with x=0.2 to 0.3.

Basically, the barrier layers 13 and 15 are high-resistance layers containing no impurities; however, they have carrier supply layers 13a and 15a, respectively, which contain an n-type impurity in high concentration. Each of the carrier supply layers 13a and 15a is a certain distance (say, about 2 to 4 nm) away from the channel layer 14.

Each of the carrier supply layers 13a and 15a has a prescribed thickness (say, about 4 nm) and is doped with an n-type impurity (Si) in a prescribed dose (say, $1.0 \times 10^{12}$ to $2.0 \times 10^{12}/cm^2$). Each of the undoped high-resistance layers 13b and 15b (between each of the carrier supply layers 13a and 15a and the channel layer 14) has a thickness (say, about 2 nm) which is smaller than that of the carrier supply layers 13a and 15a.

The channel 14 functions as a current passage between the source electrode 22a and the drain electrode 22b. The channel 14 is formed from a semiconductor having a narrower bandgap than the semiconductor forming the barrier layers 13 and 15.

Such a semiconductor should preferably be undoped InGaAs (mixed crystal), specifically $In_xGa_{1-x}As$, where x=0.1 to 0.2. Thus, the channel layer 14 accumulates carriers supplied from the carrier supply layer 13a of the first barrier layer 13 and the carrier supply layer 15a of the second barrier layer 15.

The stopper layer 16 stops etching when the high-concentration gate impurity layer 17 undergoes selective etching. In the case where AlGaAs forms the high-concentration gate impurity layer 17, GaAs or AlGaAs that differs in composition from the high-concentration gate impurity layer 17 should form the stopper layer 16. Moreover, in the case where GaAs forms the high-concentration gate impurity layer 17, $Al_xGa_{1-x}As$, where x=0.5 should preferably forms the stopper layer 16.

The high-concentration gate impurity layer 17 is formed from a semiconductor having a narrower bandgap than the semiconductor forming the channel 14. A preferred example of such a semiconductor is $Al_xGa_{1-x}As$, where x=0.2 to 0.3. Alternatively, the high-concentration gate impurity layer 17 is doped with a p-type impurity (say, Zn) in a prescribed dose (say, about $2 \times 10^{19}/cm^2$).

The gate electrode 21 has a laminate structure composed of titanium (Ti), platinum (Pt), and gold (Au), which are placed on top of the other, with Ti close to the substrate.

Each of the source electrode 22a and the drain electrode 22b has a laminate structure composed of gold-germanium (AuGe), nickel (Ni), and gold (Au), which are placed on top of the other, with AuGe close to the substrate. They are in ohmic contact with the barrier layer 15 through the stopper layer 16.

The semiconductor device pertaining to one embodiment of the present invention is produced by the process explained in the following with reference to FIGS. 2A to 2P.

Figure 2A:
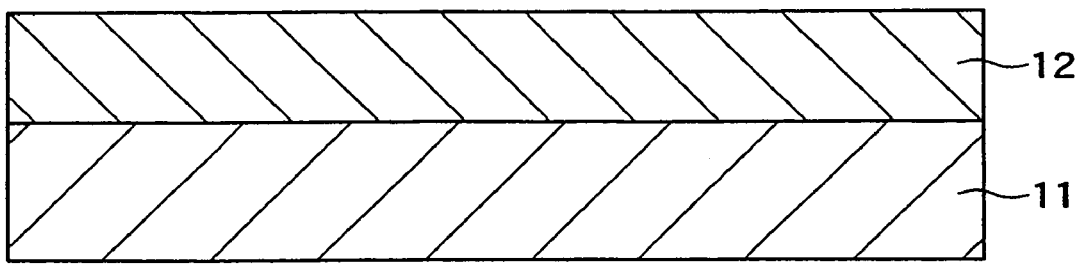
FIGS. 2A to 2C are sectional views showing the step of forming a carrier supply layer for a first barrier layer according to a method of producing a semiconductor device.

In the first step shown in FIG. 2A, a substrate 11 of half-insulating single-crystal GaAs undergoes MOCVD (Metal Organic Chemical Vapor Deposition) for epitaxial growth of a buffer layer 12, which is composed of undoped GaAs and has a prescribed thickness, say 3 to 5 µm.

Figure 2B:
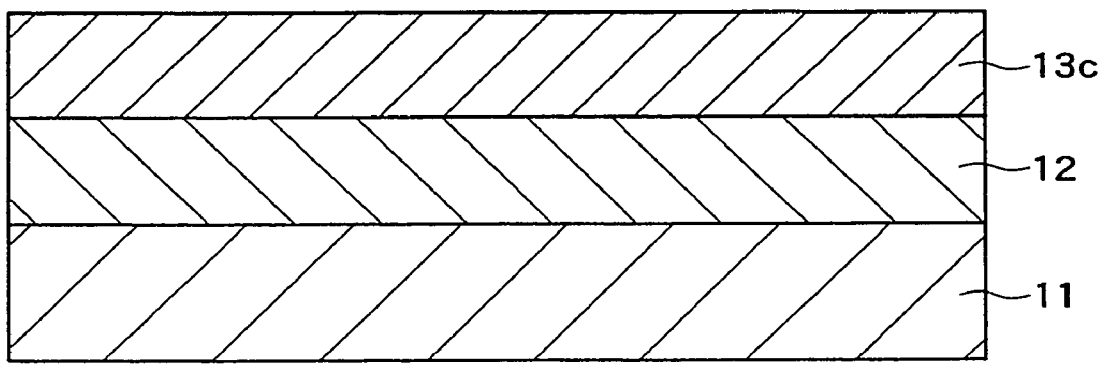

In the next step shown in FIG. 2B, the buffer layer 12 undergoes MOCVD for epitaxial growth of a high-resistance layer 13c, which is composed of undoped AlGaAs and has a prescribed thickness, say about 200 nm.

Figure 2C:
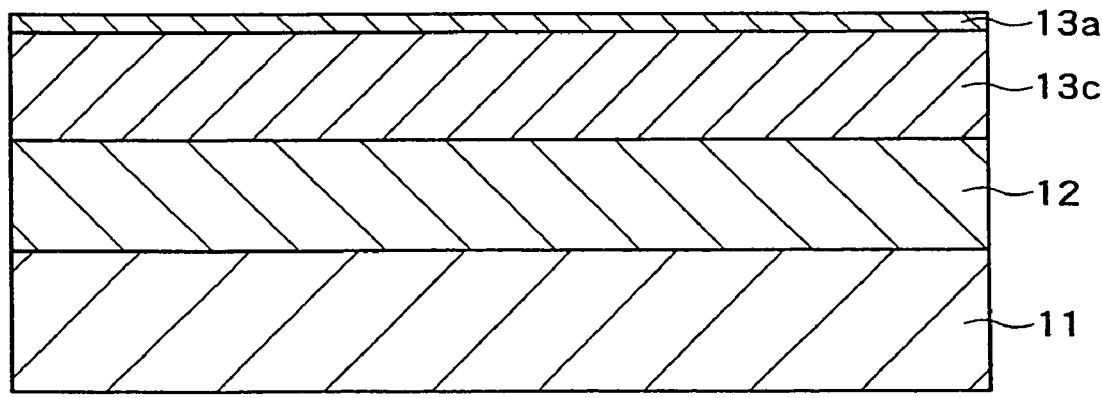

In the next step shown in FIG. 2C, the high-resistance layer 13c undergoes MOCVD for epitaxial growth of a carrier supply layer 13a, which is composed of n-type AlGaAs doped with silicon (as an n-type impurity) and has a prescribed thickness, say about 4 nm.

Figure 2D:
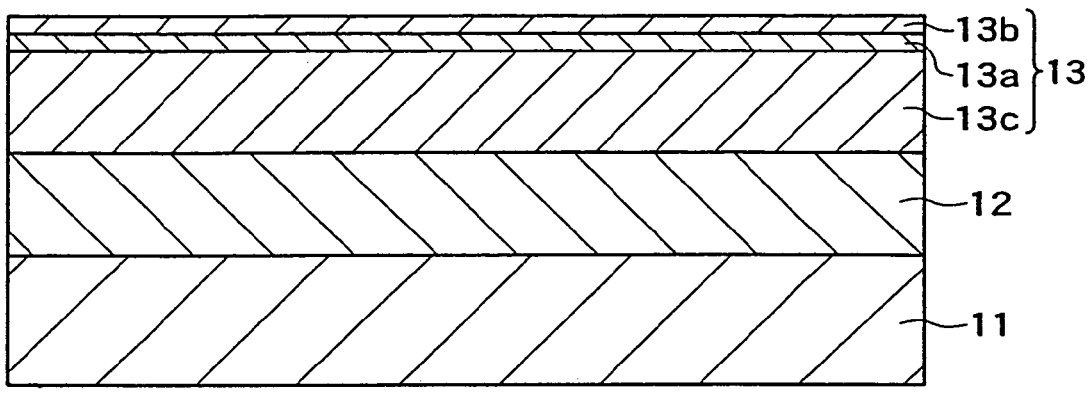
FIGS. 2D to 2F are sectional views showing the step of forming a high-resistance layer for a second barrier layer, subsequent to the step of shown in FIGS. 2A to 2C, of producing a semiconductor device.

In the next step shown in FIG. 2D, the carrier layer 13a undergoes MOCVD for epitaxial growth of a high-resistance layer 13b, which is composed of undoped AlGaAs and has a prescribed thickness of about 2 nm. Thus there is formed a first barrier layer 13 including the high-resistance layer 13c, the carrier supply layer 13a, and the high-resistance layer 13b.

Figure 2E:
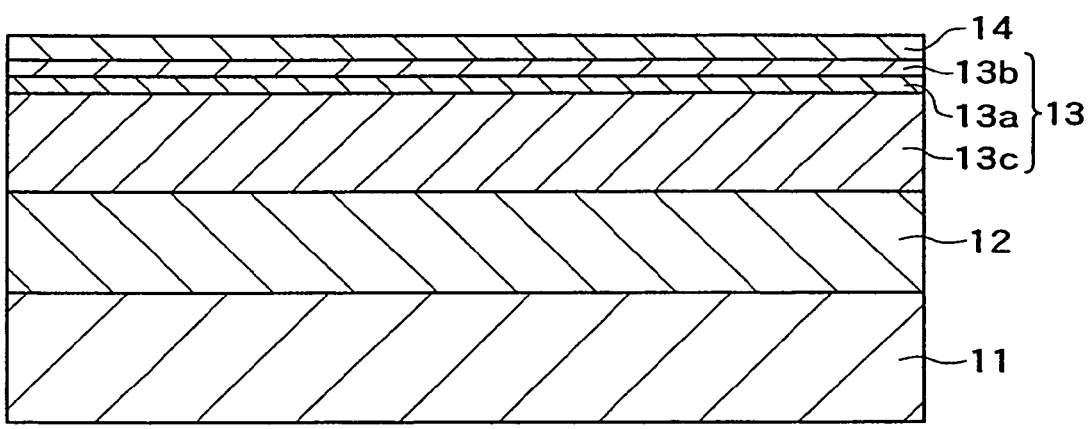

In the next step shown in FIG. 2E, the first barrier layer 13 undergoes MOCVD for epitaxial growth of a channel layer 14, which is composed of undoped InGaAs and has a prescribed thickness, say about 10 nm.

Figure 2F:
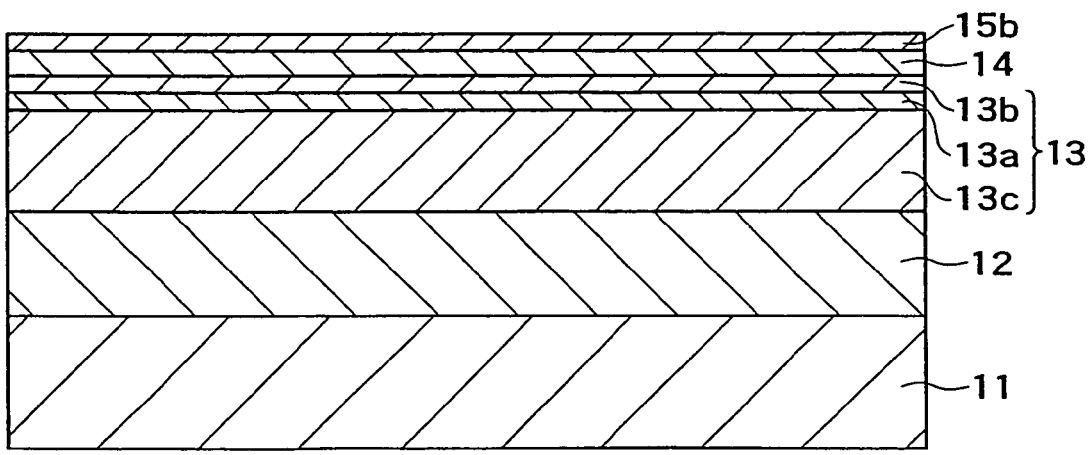

In the next step shown in FIG. 2F, the channel layer 14 undergoes MOCVD for epitaxial growth of a high-resistance layer 15b, which is composed of undoped AlGaAs and has a prescribed thickness, say about 2 nm.

Figure 2G:
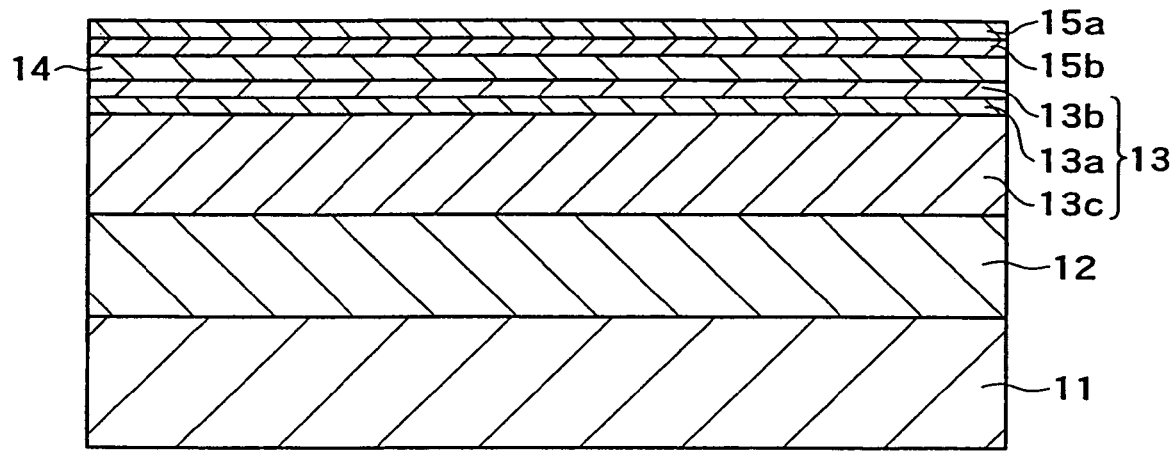
FIGS. 2G and 2H are sectional views showing the step of forming the second barrier layer, subsequent to the step of shown in FIGS. 2D to 2F, of producing a semiconductor device.

In the next step shown in FIG. 2G, the high-resistance layer 15b undergoes MOCVD for epitaxial growth of a carrier supply layer 15a, which is composed of n-type AlGaAs doped with silicon (as an n-type impurity) and has a prescribed thickness, say about 4 nm.

Figure 2H:
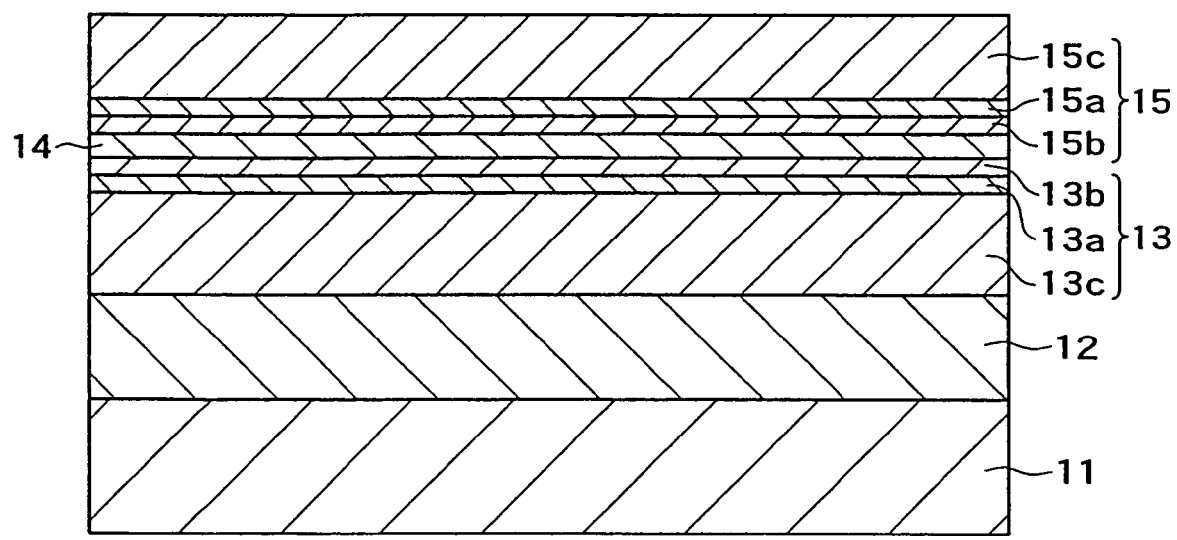

In the next step shown in FIG. 2H, the carrier layer 15a undergoes MOCVD for epitaxial growth of a high-resistance layer 15c, which is composed of undoped AlGaAs and has a prescribed thickness, say about 130 nm. Thus there is formed a second barrier layer 15 including the high-resistance layer 15c, the carrier supply layer 15a, and the high-resistance layer 15b.

In the next step shown in FIG. 2I, the second barrier layer 15 undergoes MOCVD for epitaxial growth of a stopper layer 16, which is composed of GaAs and has a prescribed thickness, say about 130 nm.

In the next step shown in FIG. 2J, the stopper layer 16 undergoes MOCVD for epitaxial growth of a high-concentration gate impurity layer 170, which is composed of p-type AlGaAs heavily doped with Zn in a prescribed dose, say equal to or more than $2 \times 10^{19}/cm^3$.

The epitaxial layer except for the regions in which transistors are formed is removed by mesa-etching for element isolation.

Figure 2K:
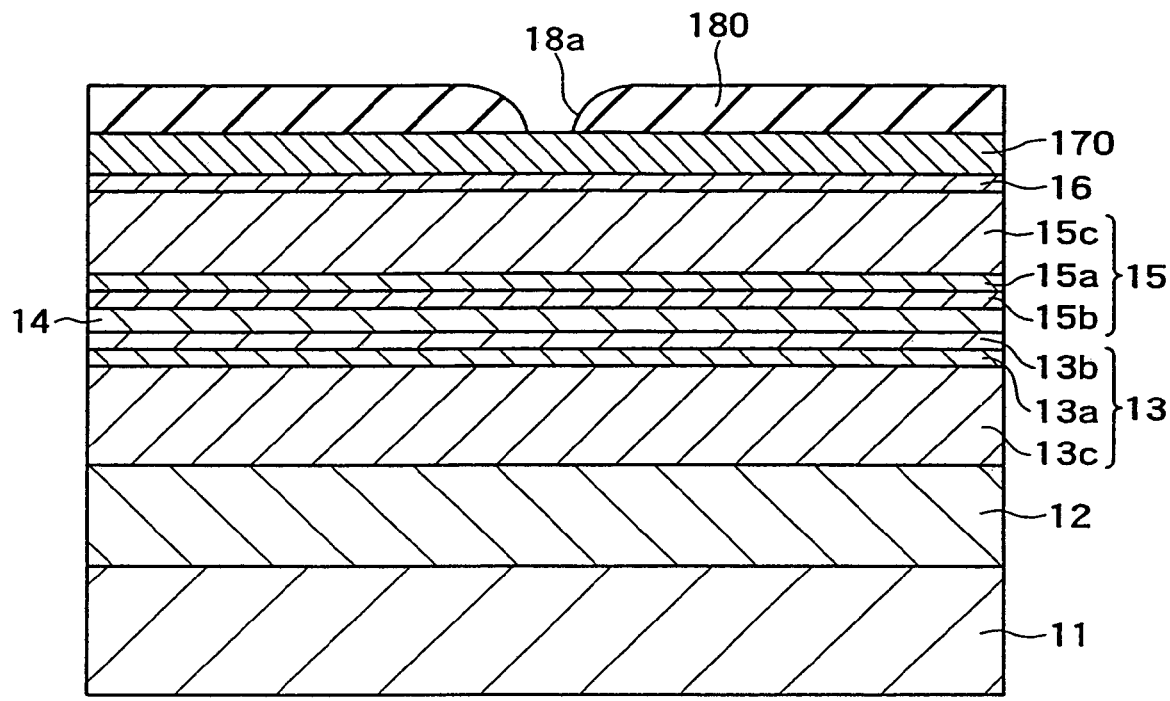
FIGS. 2K and 2L are sectional views showing the step of forming a gate impurity region, subsequent to the step of shown in FIGS. 2I and 2J, of producing a semiconductor device.

In the next step shown in FIG. 2K, the high-concentration gate impurity layer 170 undergoes CVD (Chemical Vapor Deposition) with silicon nitride (SiN) so as to form an insulating film (masking layer) 180. Then, etching is performed-through a resist mask with a prescribed pattern, so as to form an opening 18a in the insulating film 180. This opening is used to form the gate impurity region.

Figure 2L:
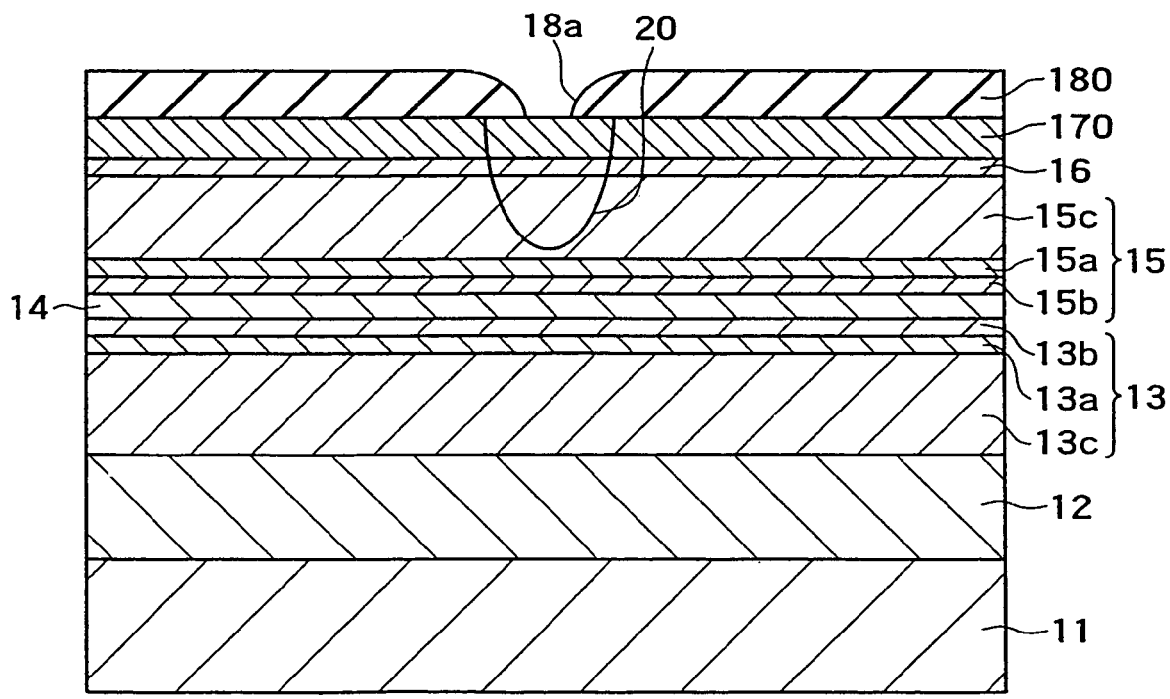

In the next step shown in FIG. 2L, a gate impurity region 20 is formed in the high-concentration gate impurity layer 170, the stopper layer 16, and the barrier layer 15, by vapor phase diffusion with zinc (Zn) as a p-type impurity through the opening 18a in the insulating film 180. This vapor phase diffusion employs the insulating film 180 as the mask.

Ion implantation may-carry out the doping of a p-type impurity; however, in this case it is necessary to activate the doped impurity by high temperature heating. Therefore, vapor-phase dispersion is preferable. The depth of diffusion is controlled by regulating the duration of vapor phase diffusion.

Figure 2M:
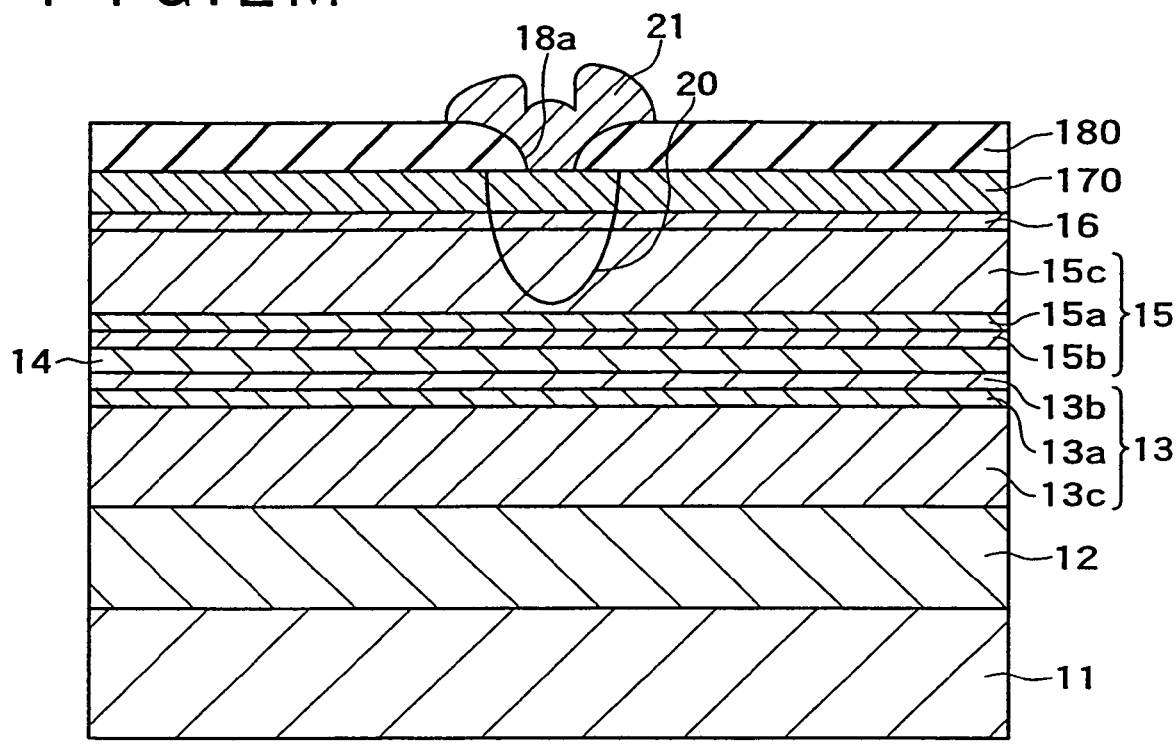
FIGS. 2M and 2N are sectional views showing the step of forming a gate, subsequent to the step of shown in FIGS. 2K and 2L, of producing a semiconductor device.

In the next step shown in FIG. 2M, the entire surface (including the opening 18a) of the insulating film 180 undergoes vacuum evaporation to sequentially form Ti layer (100 nm thick), Pt layer (50 nm thick), and Au layer (220 nm thick). These layers constitute the gate metal. The gate metal (except for the part constituting the gate electrode) undergoes sputter etching through a mask having a prescribed pattern. Thus there is formed the gate electrode 21.

The thus formed gate electrode 21 is in contact with the high-concentration gate impurity layer 170. Therefore, good ohmic contact is established between metal and semiconductor at the transistor gate.

Figure 2N:
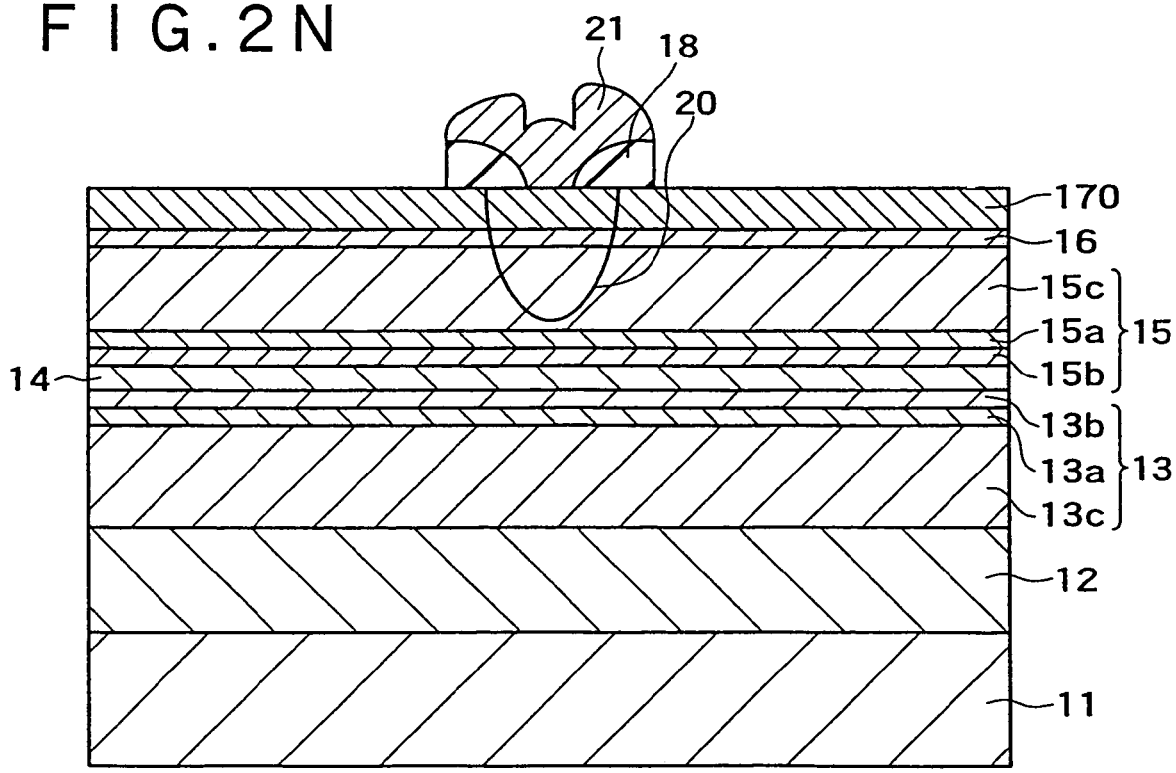

In the next step shown in FIG. 2N, the insulating layer 180 (except for the part under the gate electrode) undergoes etching so as to form an insulating film 18. This etching is carried out to such an extent that the high-concentration gate impurity layer 170 of AlGaAs doped with a p-type impurity is exposed.

Figure 2O:
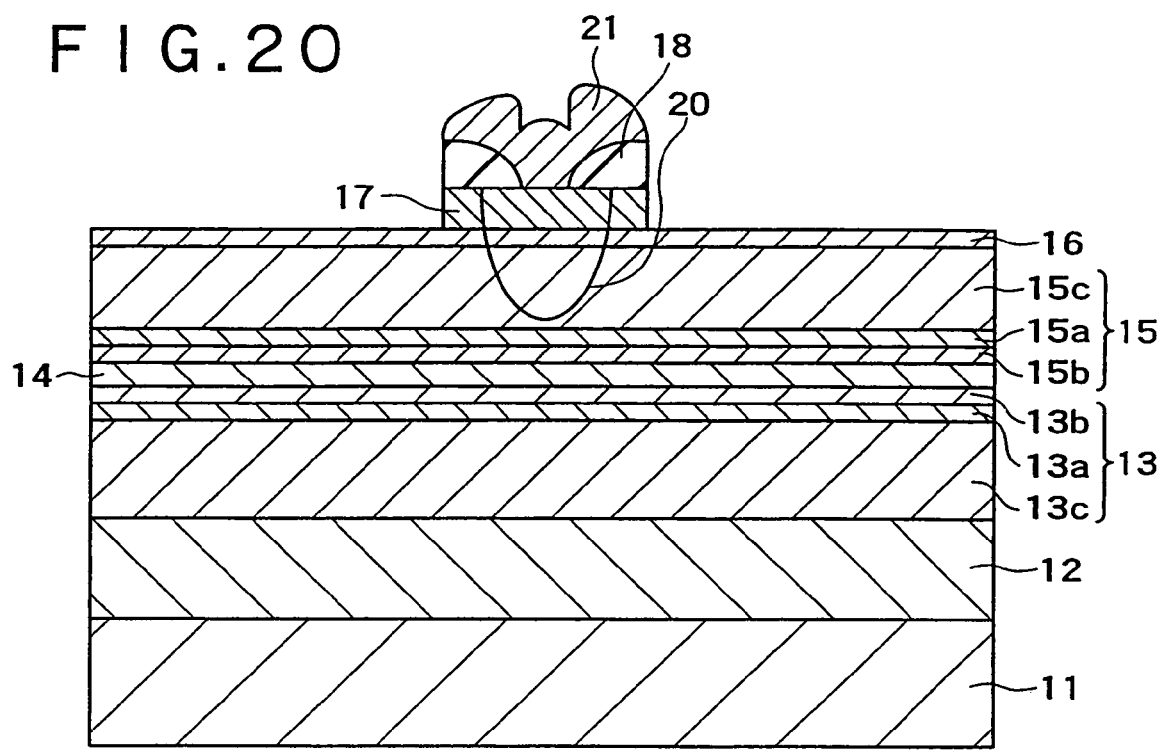
FIGS. 2O and 2P are sectional views showing the step of forming a insulating film, subsequent to the step of shown in FIGS. 2M and 2N, of producing a semiconductor device.

In the next step shown in FIG. 2O, the high-concentration gate impurity layer 170 undergoes etching by using the gate electrode 21 and the insulating film 18 as a mask, to such an extent that the stopper layer 16 is exposed. Thus, there is formed the high-concentration gate impurity layer 17 in an island-like shape.

Figure 2P:
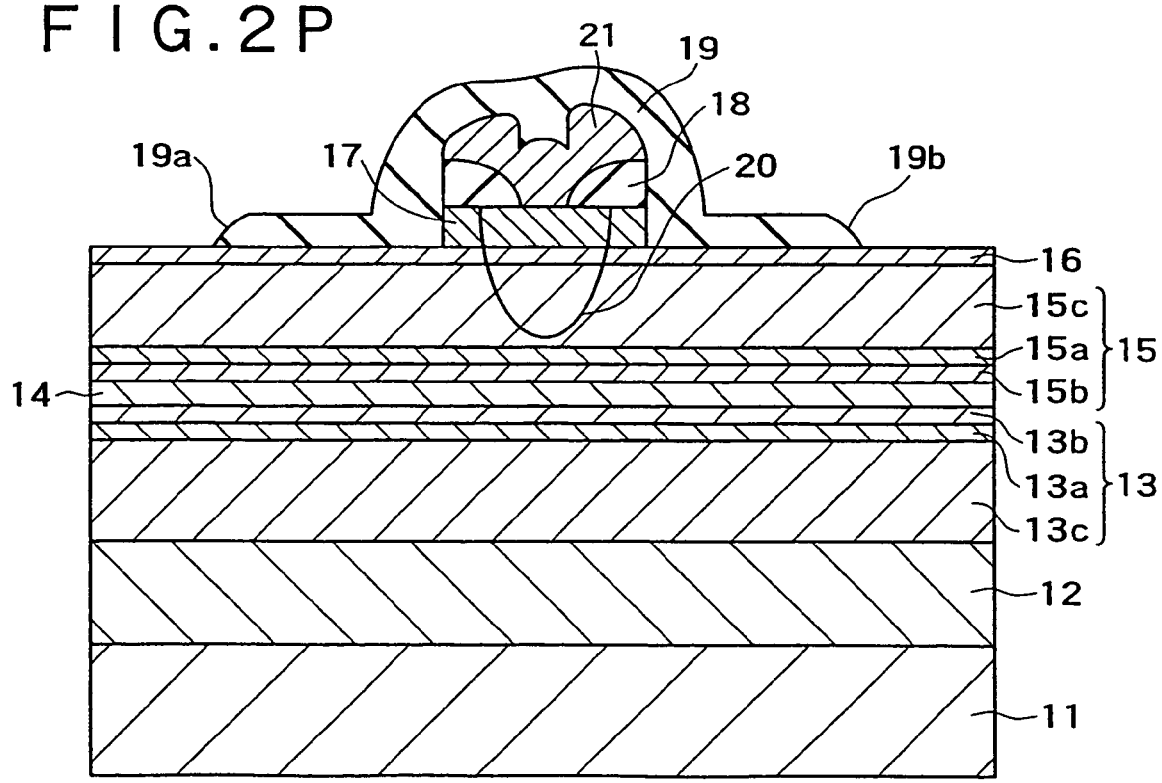

In the next step shown in FIG. 2P, the gate electrode 21 and the stopper layer 16 are entirely covered with an insulating film 19 that is formed by CVD from silicon nitride (SiN). The insulating film 19 undergoes selective etching through a resist mask, so as to form openings 19a and 19b respectively in the source electrode region and the drain electrode region.

Subsequently, the entire surface (including the openings 19a and 19b) of the insulating film 19 undergoes vacuum evaporation repeatedly with gold-germanium alloy (AuGe), nickel (Ni), and gold (Au). The resulting layers are patterned and undergoes heat treatment for alloying at about 400° C. Thus there are formed the source electrode 22a and the drain electrode 22b. In this way it is possible to produce the semiconductor device shown in FIG. 1.

According to the above-mentioned embodiment, the semiconductor device and the process for production thereof are characterized in that the high-concentration gate impurity layer 17 just below the gate electrode 21 is previously prepared in the stage of forming the substrate. This offers the advantage that a better ohmic contact is established between the gate electrode 21 and the high-concentration gate impurity layer 17 than in the case where an undoped barrier layer 15 is doped with a p-type impurity by vapor phase dispersion and the gate electrode is formed thereon afterward. The good ohmic contact contributes to the characteristic properties of the semiconductor device intended for power amplifier.

Moreover, according to the above-mentioned embodiment, the depth of the gate impurity region 20 just below the gate electrode 21 is controlled by vapor phase dispersion. This in turn controls the distance (d) between the gate impurity region 20 and the channel layer 14. The advantage of the controlled distance is that it is possible to increase the built-in potential (φbi) between the semiconductor constituting the channel layer 14 and the gate impurity region 20 just below the gate. This permits the semiconductor device to operate only with a single positive power supply.

Moreover, according to the above-mentioned embodiment, the semiconductor device has the high-concentration impurity layer 17, between the channel layer 14 and the gate electrode 21 that is formed from a semiconductor having a broader bandgap than the semiconductor forming the channel layer 14. This reduces the dependence of the mutual conductance (Gm) and the gate-source capacity (Cgs) on gate voltage (Vg). This in turn contributes to power-added efficiency.

Thus, the semiconductor device of the present invention exhibits improved controllability of threshold voltage (Vth) while maintaining the mutual conductance characteristics.

Figure 3:
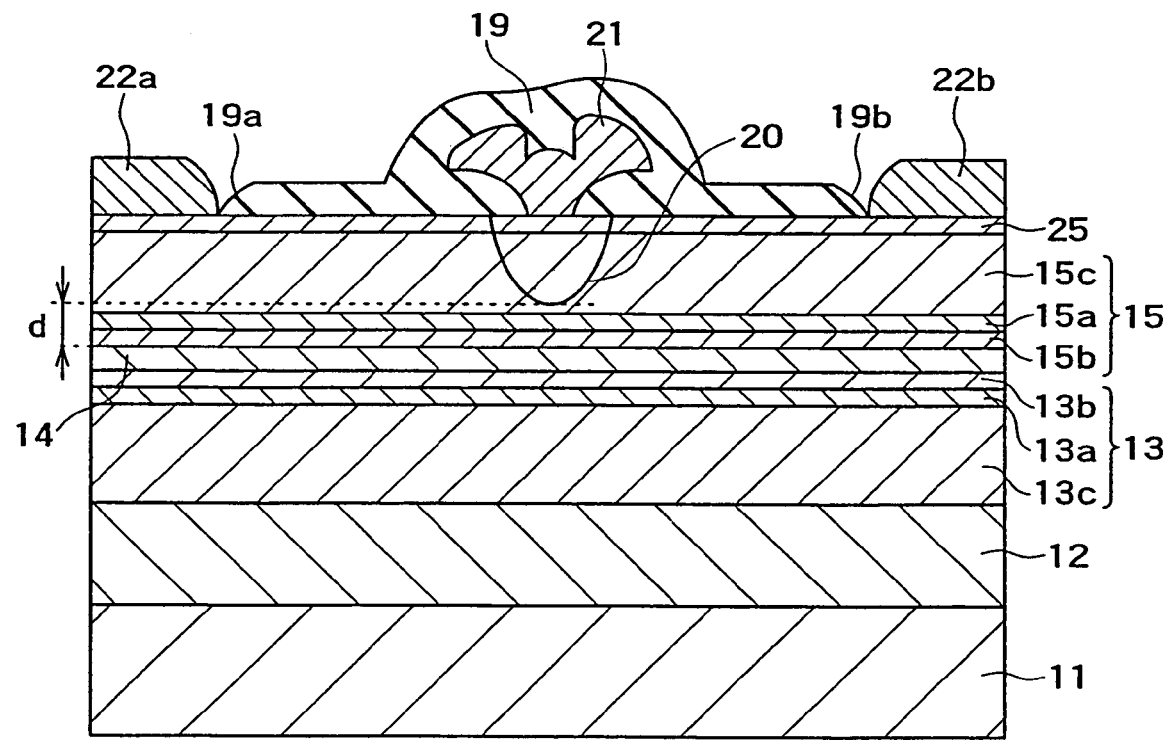
FIG. 3 is a sectional view showing the structure of a semiconductor device pertaining to another embodiment of the present invention.
Figure 4:
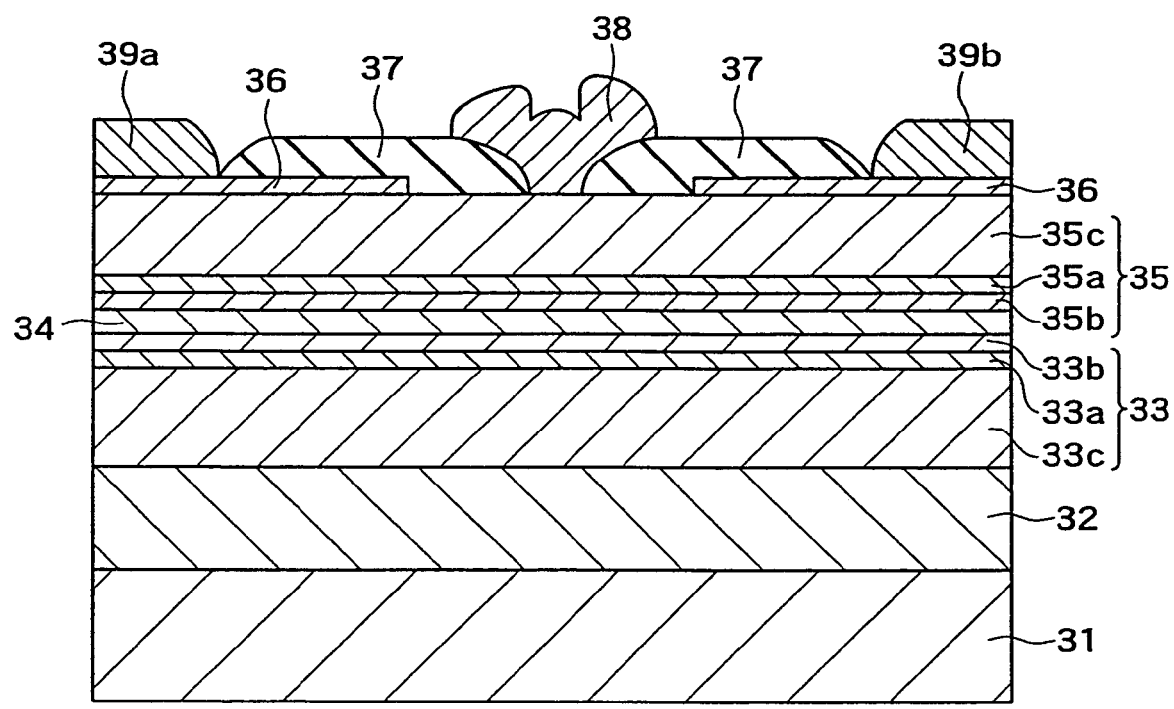
FIG. 4 is a sectional view showing the structure of a conventional PHEMT.

A semiconductor device according to another embodiment of the present invention is shown in FIG. 3. It has the high-resistance layer 15c entirely covered with a p-type semiconductor region 25 of AlGaAs doped with a p-type impurity. The p-type semiconductor region 25 and the high-resistance layer 15c are doped with a p-type impurity (say, Zn) by vapor phase dispersion at their part just below the gate electrode 21, so as to form the gate impurity region 20. The gate electrode 21 connecting to the surface of the gate impurity region 20 is formed. The source electrode 22a and the drain electrode 22b are formed on the p-type semiconductor region 25, with the gate electrode 21 in between. The p-type semiconductor region 25 has an adequate thickness and an adequate impurity concentration so that depletion takes place in the region between the source electrode 22a and the gate electrode 21 and in the region between the drain electrode 22b and the gate electrode 21. The p-type semiconductor region is formed so thin that alloying takes place in its part just below the source electrode 22a and the drain electrode 22b. Other parts than mentioned above are the same as those in the semiconductor device shown in FIG. 1. Like reference characters are given to corresponding parts, without repeating their explanation. Incidentally, the source electrode 22a and the drain electrode 22b may also be formed on the p-type semiconductor region 25 with an n-type GaAs layer placed thereunder.

The p-type semiconductor region 25 is formed by epitaxial growth with doping with a p-type impurity. Other layers and the electrodes are formed in the same way in the process explained in the previous embodiment.

The semiconductor device of the present invention shown in FIG. 3 is also capable of operating with a single positive power supply and has a reduced gate resistance. It also produces the same effect as the semiconductor device shown in FIG. 1.

The present invention is not limited to the embodiments mentioned above. For example, the semiconductor device may be so modified as to have the single-heterostructure, with the buffer layer 12, high-resistance layer 13c, and carrier supply layer 13a omitted.

The gate impurity region 20 is doped with a p-type impurity that can be either zinc (Zn) or carbon (C).

The idea of the present invention its applicable to InP substrates as well as GaAs substrates. In the case of InP substrate, the buffer layer 12 on the substrate 11 is formed from undoped InP, the high-resistance layers (13b, 13c, 15b, 15c) are formed from undoped $Al_xIn_{1-x}As$ (x=0.4 to 0.5), the channel layer 14 is formed from undoped $In_xGa_{1-x}As$ (x=0.5 to 0.6), and the carrier supply layers (13a, 15a) are formed from n-type $Al_xIn_{1-x}As$ (x=0.4 to 0.5). The stopper layer 16 forms on the high-resistance layer 13c of $Al_xIn_{1-x}As$. The stopper layer 16 is from AlInAs that differs in the compositional ratio of In. The high-concentration gate impurity layer 17 forms on the stopper layer 16. The layer 17 is in an island-like shape from AlInAs or InP doped with a p-type impurity. Then, the gate impurity region 20 is formed by doping (vapor phase diffusion) with a p-type impurity (Zn or C). The gate electrode 21 of Ti/Pt/Au forms on the high-concentration impurity layer 17 of AlInAs in an island-like shape, through the opening in the insulating film 18, in the same way as mentioned above. Also, the source electrode 22a and drain electrode 22b forms on the stopper layer 16. The source electrode 22a and drain electrode 22b are layers obtained by heat treatment (for alloying) of the laminated film of AuGe, Ni, and Au, in the same as mentioned above.

Various changes and modifications may be made in the invention without departing from the spirit and scope thereof.

The semiconductor device according to the present invention is capable of operating with a single positive power supply and has a reduced gate resistance.

What is claimed is:

1. A semiconductor device comprising:
   a channel layer;
   a first semiconductor layer formed above said channel layer;
   a second semiconductor layer in an island-like shape doped with a conductive impurity and formed above said first semiconductor layer, an etching stop layer formed between the second semiconductor layer and the first semiconductor layer which extends beyond the dimensions of the second semiconductor layer; and
   a conductive impurity region formed within said second semiconductor layer and extending only partially through said first semiconductor layer;
   a gate electrode formed over said second semiconductor layer;
   wherein said conductive impurity region is formed to control the threshold value of current flowing through said channel layer, and
   wherein the second semiconductor layer is doped with P-type impurity (Zn) by gas phase diffusion.

2. The semiconductor device as defined in claim 1, wherein said first semiconductor layer is formed from a semiconductor material having a larger bandgap than that from which said channel layer is formed.

3. The semiconductor device as defined in claim 2, wherein said first semiconductor layer has a carrier supply layer which contains an impurity of a first conduction type and supplies charges to said channel layer, and said conductive impurity region of a second conduction type is formed in said first and second semiconductor layers between said carrier supply layer and said gate electrode.

4. The semiconductor device as defined in claim 1, wherein said channel layer is formed from InGaAs and said first semiconductor layer is formed from AlGaAs.

5. The semiconductor device as defined in claim 1, further comprising a source electrode and a drain electrode which are formed on said first semiconductor layer and are separated from each other with said gate electrode in between.

6. The semiconductor device as defined in claim 3, further comprising a third semiconductor layer which is formed under said channel layer and is formed from a semiconductor material having a larger bandgap than that from which said channel layer is formed.

7. The semiconductor device as defined in claim 6, wherein said third semiconductor layer has a carrier supply layer which contains an impurity of a first conduction type and supplies charges to said channel layer.

* * * * *